(12) United States Patent
Lai et al.

(10) Patent No.: US 6,582,858 B2
(45) Date of Patent: Jun. 24, 2003

(54) ALTERNATING PHASE SHIFTING MASK

(75) Inventors: Chien-Wen Lai, Taipei Hsien (TW); Chien-Ming Wang, Hsin-Chu Hsien (TW); Feng-Yuan Chang, Miao-Li Hsien (TW); I-Hsiung Huang, Kao-Hsiung (TW)

(73) Assignee: United Microelectronics Corp., Hsin-Chu (TW)

( * ) Notice: Subject to any disclaimer, the term of this patent is extended or adjusted under 35 U.S.C. 154(b) by 10 days.

(21) Appl. No.: 09/682,480

(22) Filed: Sep. 7, 2001

(65) Prior Publication Data

US 2003/0049544 A1 Mar. 13, 2003

(51) Int. Cl.$^7$ .................................................. G03F 9/00
(52) U.S. Cl. ......................................................... 430/5
(58) Field of Search ............................. 430/5, 322, 311, 430/313; 716/19, 21

(56) References Cited

U.S. PATENT DOCUMENTS 5,827,625 A * 10/1998 Lucas et al. .................... 430/5

* cited by examiner

Primary Examiner—S. Rosasco
(74) Attorney, Agent, or Firm—Winston Hsu

(57) ABSTRACT

The present invention provides An alternating phase shifting mask (Alt-PSM), that is to be used in a double exposure lithographic process with a light source of 248 nm. The Alt-PSM comprises: (1) a quartz substrate; (2) at least one semi-dense line on the substrate, wherein the semi-dense line is adjacent to a clear region with a width larger than 2 nm on one side and on the other side is adjacent to a dense-line pattern with a narrow pitch; (3) a first phase shifting region, which is located between the dense line pattern and the semi-dense line pattern and is adjacent to the semi-dense line; and (4) a second phase shifting region with a predetermined width, which is adjacent to the semi-dense line and located on the side opposite to the first phase shifting region; wherein the phase difference between the first phase shifting region and the second phase shifting region is 180 degree.

14 Claims, 10 Drawing Sheets

ALTERNATING PHASE SHIFTING MASK

BACKGROUND OF INVENTION

1. Field of the Invention

The present invention provides a phase shifting mask (PSM), particularly an alternating phase shifting mask (Alt-PSM) that can rectify spherical aberration induced by semi-dense lines and that can be used in a double exposure lithographic process with a light source of 248 nm. Besides, this invention can expand process window.

2. Description of the Prior Art

In the circuit making processes, lithographic process has not only been mandatory technique but also played an important role in limiting feature size. Only by lithographic process, a wafer producer can precisely and clearly transfer a circuit pattern onto a substrate. In a lithographic process, a designed pattern, such as a circuit pattern or a doping pattern, is created on one or several photo masks, then the pattern on the mask is transferred by light exposure, with a stepper and scanner, onto a substrate. Recently, the most mature lithographic technique is optical lithographic technique, of which the light sources include KrF laser (248 nm), ArF laser (193 nm) and F2 laser (157 nm) . . . etc., among which KrF laser's light exposure technique is the most developed. The other two light exposure techniques and non-optical lithographic techniques, such as extreme UV and e-beam, are still underdeveloped.

According to the International Technology Roadmap for Semiconductor (ITRS) published by Semiconductor Industry Association (SIF), the smallest size of a semiconductor device should be reduced to less than 0.13 nm (about 130 nm) by the year of 2002. The light exposure technique with an ArF laser, with wavelength of 193 nm, can meet this requirement, but the cost is too high. Therefore, in order to achieve the same lithography performance as ArF laser and to prolong the life of a 248 nm lithographic equipment, a new proposal combining the resolution enhancement technique (RET) and KrF laser's light exposure technique, is being developed.

Recently, many RET techniques, which can reduce devices' sizes to the smallest with a light source of certain wavelength, employ a double exposure lithography technique with an alternating phase shifting mask (Alt-PSM). Beside an alternating phase shifting mask, the double exposure lithography technique employs a trim mask to complete pattern transferring. This technique was first developed by Wang, et al. from Numerical Technologies, Inc., (NTI), and was presented in detail in U.S. Pat. No. 5,858,580. However, this optical proximity correction (OPC) technique with Alt-PSM still has some problems, including transmission imbalance which occurred in phase shifted and non-phase shifted regions and other flaws caused by Alt-PSM.

Besides, with the increase of devices' packing density, pitches-particularly the ones between gate electrodes are reduced, resulting in some dense lines, semi dense lines or isolated lines on the photo mask. Unfortunately, conventional Alt-PSM can't avoid spherical aberration caused by these semi-dense line patterns, narrowing the process window created by the dense lines and the semi-dense lines formed on the resist, and hampering the quality of the lithographic process.

Please refer to FIG. 1; FIG. 1 is an enlarged partial view of an Alt-PSM according to the prior art. In order to explain the faults of the prior technique, FIG. 1 only shows the region 10 related to the present invention. As shown in here, the region 10 comprises a dense-line region 12 and a semi-dense-line region 14, wherein the dense-line region 12 comprises two closely arrayed dense lines 4a and b formed on the quartz mask. The dense lines 4a and b and the semi-dense line 5 are made of opaque material, such as chromium (CR). The pitch 20 is the sum of line width (L) and the line space (S). Usually, the semi-dense line 5 has a pitch of less than 400 nm from the dense lines 4a and b on its one side and a pitch larger than 400 nm on the other side. Moreover, between the dense line 4a and the dense line b is a phase shifting region 1 of 180 degree, and between the dense line 4a, and the semi-dense line 5 a phase shifting region 2 of zero degree, and the other side of the semi-dense line 5 is a phase shifting region 3 of 180 degree.

Please refer to FIG. 2; FIG. 2 is a plot of center focus vs. pitch from an Alt-PSM according to the prior art, wherein the Y-axis is center focus in um, the X-axis is pitch in nm. As shown in the plot, when a pitch on an Alt-PSM exceeds 500 nm, namely a pattern comprising semi-dense lines, the center focus would shift; as a pith is between 300 nm and 400 nm, the center focus is between 0.45 and 0.4 um; as a pitch increases to between 650 nm and 700 nm, the center focus shifts to around 0.7 um and results in insufficient width of process window created by the dense lines (pitches less than 400 nm) and the semi-dense lines (pitches more than 400 nm). As shown in FIG. 3, in which the Y-axis is focus, the region 25 is the domain of the process window created by the dense-lines; the region 26 is the domain of the process window created by the semi-dense lines. Shifting of the center focus of the semi-dense line pattern results in a size-reduction of the region 27, which is the overlapping area of the region 25 and the region 26, and which represents the size of the process window in the light exposing process.

SUMMARY OF INVENTION

The main purpose of the present invention is to provide an Alt-PSM, which can correct the spherical aberration caused by semi-dense lines and can increase the size of process window, and which is to be employed in a double exposure lithographic process with a light source of 248 nm.

The phase shifting mask in the preferred embodiment of the present invention comprises: 1) a quartz substrate; 2) at least one semi-dense line formed on the substrate, wherein the semi-dense line is adjacent to a clear region with a width more than 2 nm on one side and to a dense line pattern with a narrow pitch on the other side; 3) a first phase shifting region, which is located between the dense line pa tern and the semi-dense line, adjacent to the semi-dense line; and 4) a second phase shifting region with a predetermined width, adjacent to the semi-dense line opposite to the first phase shifting region, wherein the phase difference between the first phase shifting region and the second phase shifting region is 180 degree.

The Alt-PSM in another preferred embodiment comprises: 1) a quartz substrate; 2) a dense line pattern formed on the quartz substrate; 3) at least one semi-dense line pattern adjacent to the dense-line pattern; 4) a first phase shifting region with a first predetermined width, located between the dense-line pattern and the semi-dense line pattern and adjacent to the dense-line pattern; 5) a second shifting region with a second predetermined width, which is unconnected to the first shifting region, and is located between the dense line pattern and the semi-dense line pattern and adjacent to the later; and 6) a third phase shifting region with the same width as the second phase shifting region, located on the side opposite to the second phase shifting region and adjacent to the semi-dense line pattern; wherein the phase difference between the first and second phase shifting regions is zero degree, and the one between the second and third phase shifting regions is 180 degree.

DETAILED DESCRIPTION

Figure 1:
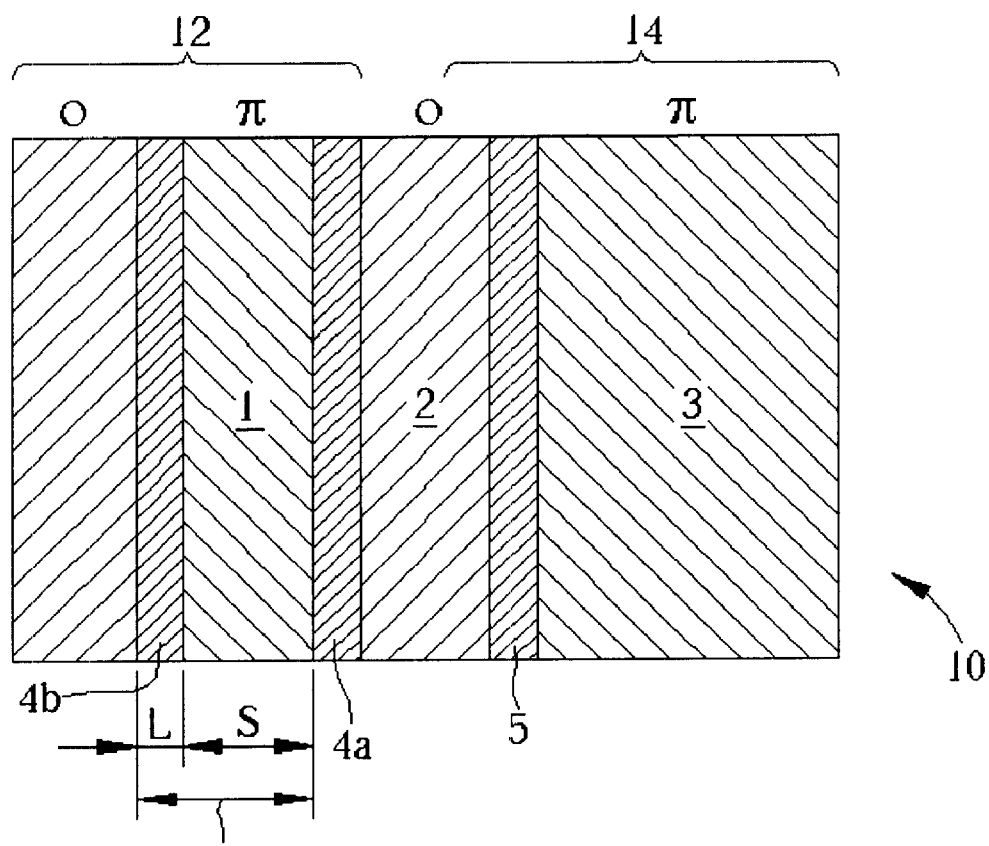
FIG. 1 is an expanded partial view of an alternating phase shifting mask according to the prior art.
Figure 2:
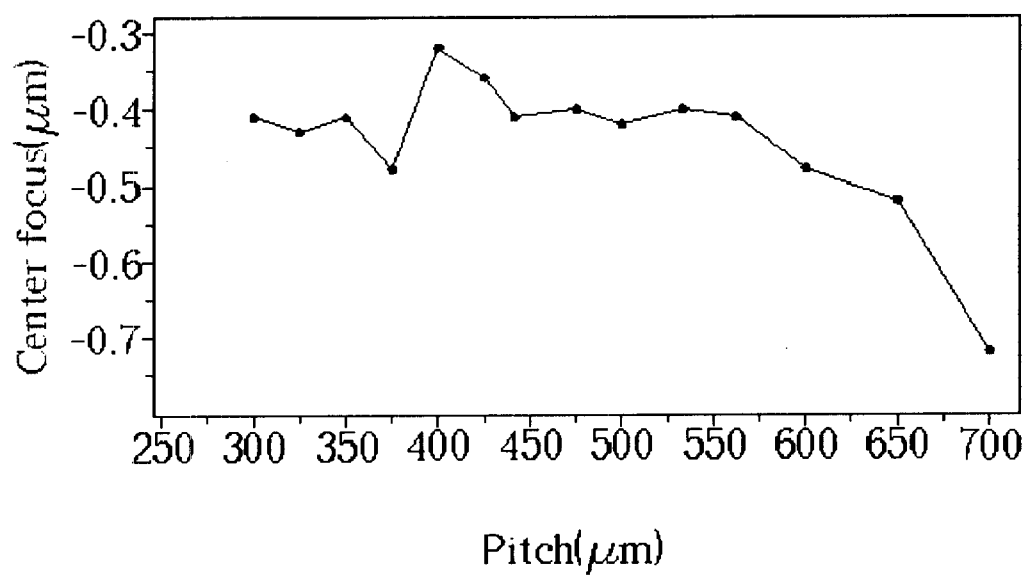
FIG. 2 is a plot of center focus vs. pitch produced by an alternating phase shifting mask according to the prior art.
Figure 3:
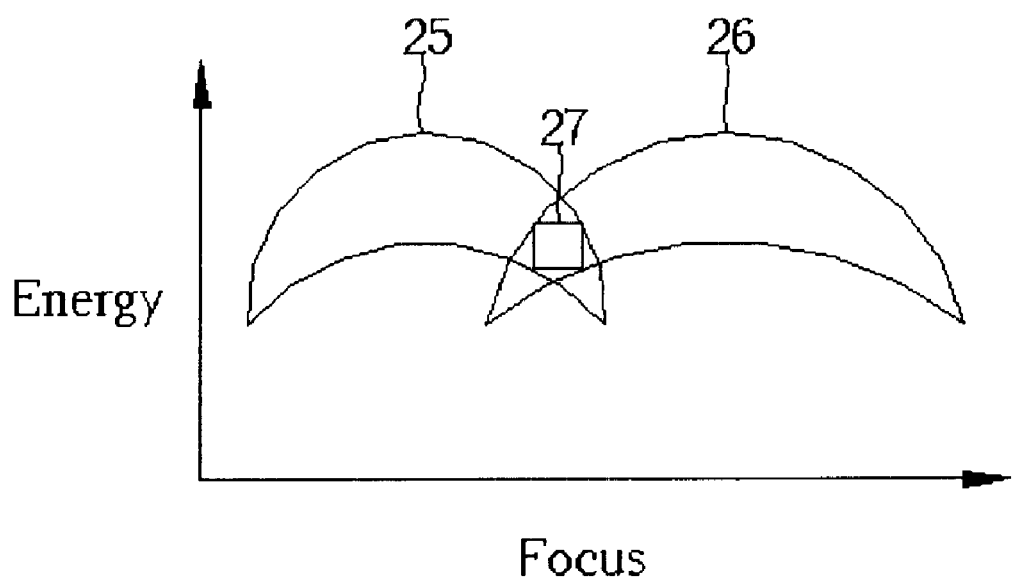
FIG. 3 is a plot of energy vs. focus produced by an alternating phase shifting mask according to the prior art.
Figure 4:
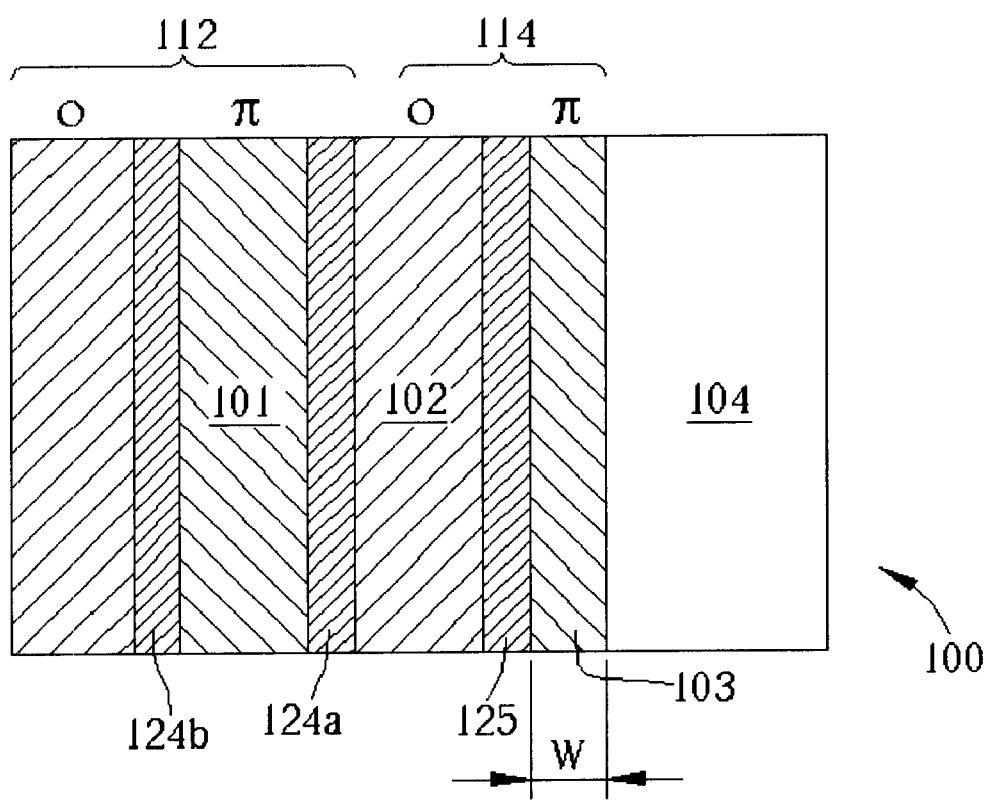
FIG. 4 is an expanded partial view of an alternating phase shifting mask according to the present invention.

Please refer to FIG. 4; FIG. 4 is an expanded partial view of an Alt-PSM according to the present invention. In order to stress the features of the present invention, FIG. 4 only shows the region 100, which is the focus of the present invention. As shown here, the region 100 has a dense line region 112 and a semi-dense line region 114. The dense line region 112 has two closely arrayed dense lines 124a and b formed on a quartz substrate. In the preferred embodiment of the present invention, the line width (L) of the dense lines 4a and b is about 0.15 nm, and the semi-dense line region 114 has a semi-dense line 125 adjacent to the dense-line region 112. The line width (L) of the semi-dense line 125 is about 0.15 nm, and the line distance (S) between the dense line 124a and the semi-dense line 125 is 0.2 nm, so the pitch between the dense line 124a and the semi-dense line 125 is about 0.35 nm. On the side of the semi-dense line 125 is a large size of the clear region 104. The dense lines 124a and b and the semi-dense line 125 are usually made of opaque material, such as Cr. In other embodiments, the dense lines 124a and b and the semi-dense line 125 can be made of Aluminum (Al) or MoSi or their equivalents. The light source used in the preferred embodiment is KrF laser (254 nm), and the numerical aperture (NA) is larger than 0.6—but the present invention is not limited to this value.

In one of the embodiment of the present invention, between the dens lines 124a and 124b is a 180 degree phase shifting region 101; between the dense line 124a and the semi-dense line 125 is a 0 degree phase shifting region 102; and on the other side of the semidense line 125 is a 180 degree phase shifting region 103 with a fixed width w. In another embodiment of the present invention, the phase in the phase shifting region 101 is 0 degree; the one in the phase shifting region 102 is 180 degree; and the one in the phase shifting region 103 is 0 degree. The long-band phase shifting region 103 only occupies a small part of the clear region 104, and is formed next to the semi-dense line 125.

The biggest difference between the present invention and the prior art is that according to the prior art, the larger phase shifting region is created on the side of the semi-dense line region with the larger pitch, which worsens the spherical aberration in the semi-dense line region; whereas according to the present invention, the width w of the shifting region 103 created on the side of the semi-dense line region with the larger pitch is limited to between 200 and 1000 nm, even as good as between 200 and 400 nm.

Figure 5:
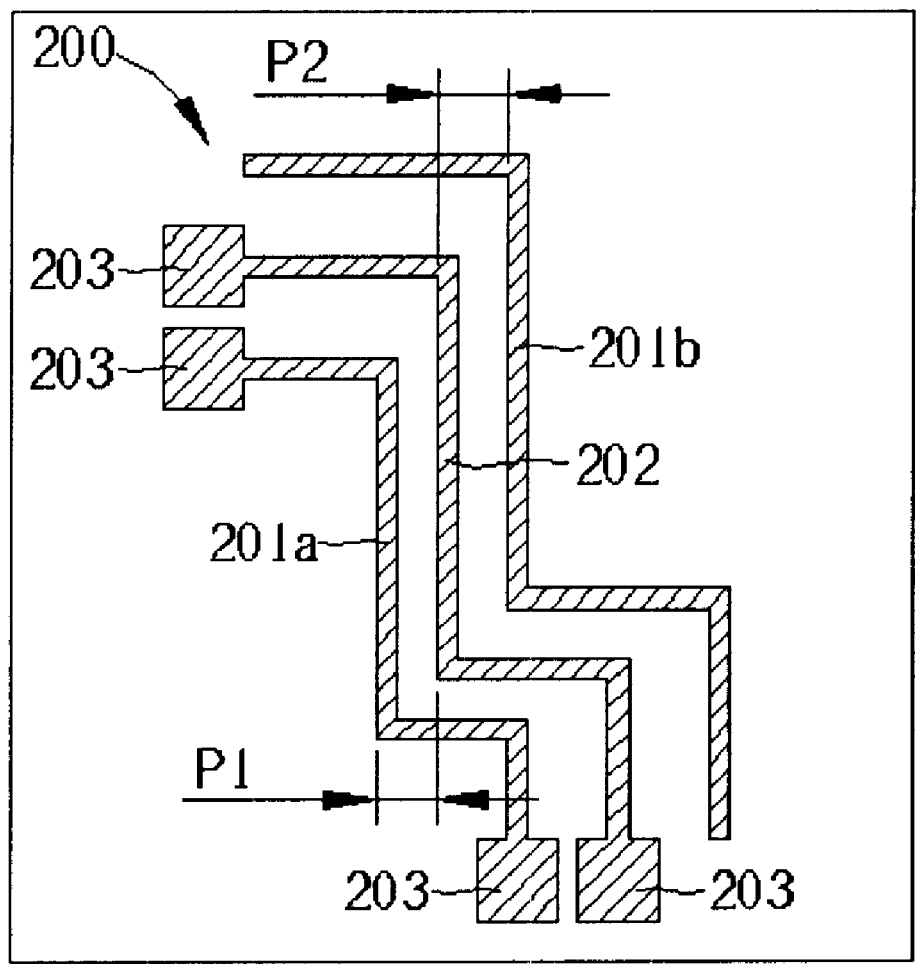
FIGS. 5 to 7 are partial views of an alternating phase shifting mask in the second embodiment according to the present invention.
Figure 6:
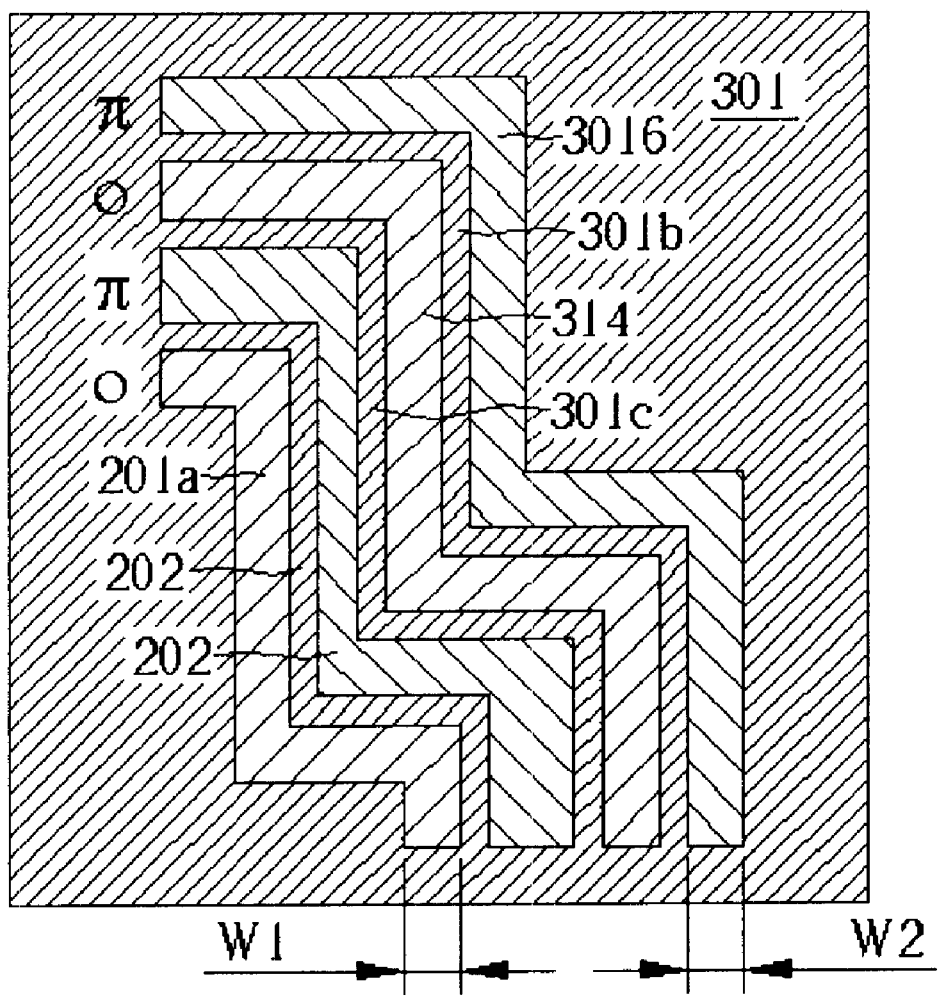
Figure 7:
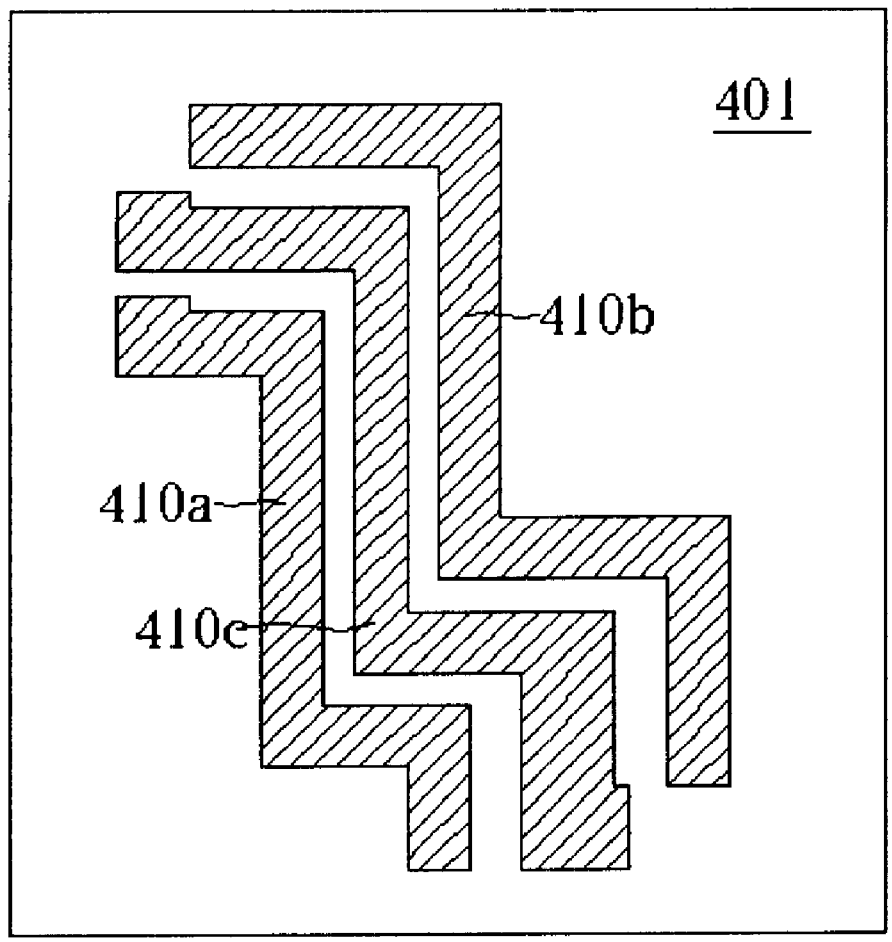

Please refer to FIGS. 5 to 7; FIGS. 5 to 7 are views of the preferred embodiment of the present invention. FIG. 5 is a view of a circuit pattern 200 to be formed on positive resist; FIG. 6 is a view of a layout of the Alt-PSM for the circuit pattern in FIG. 5; and FIG. 7 is a view of an adjusted Alt-PSM pattern. As shown in FIG. 5, the circuit pattern 200 to be on a resist comprises two semi-dense lines 201a and b with a line width smaller than 0.18 nm and a dense line 202 with a line width smaller than 0.18 nm between the semi-dense lines 201a and b. At both ends of the semi-dense line 201a and the dense-line 202 is a via pattern 203. The line distance between the semi-dense line 201a and the dense line 202 is P1, and the one between the dense line 202 and the semi-dense line 201b is P2. In this embodiment, P1 approximately equals P2; both are about 350 nm.

Please refer to FIG. 6; in order to create the target pattern in FIG. 5 on a resist and at the same time to get a larger process window, the present invention employs the layout for the Alt-PSM in FIG. 6. As shown here, the 0 degree phase 310, the 180 degree phase shifting region 312, the degree phase shifting region 314 and the 180 phase shifting region are all clear regions. The region 301 and the regions 301a, b and c are opaque regions and are made of Cr, Al or MoSi . . . etc. The 0 degree phase shifting region 310 has a predetermined width w1 and is adjacent to the region 301a's one side; the 180 degree phase shifting area 312 occupies the entire region 301a and the region 301c; the 0 degree phase shifting region 314 occupies the regions 301c and 301b; and the 180 degree phase shifting region 316 has a predetermined width w2 and is adjacent to the region 301b's one side. In order to get a better resolution, it is recommended that the width w1 of the 0 degree phase shifting region 310 and the width w2 of the 180 degree phase shifting region 316 are both larger than 200 nm; generally, w1 and w2 are between 200 nm and 1000 nm.

Please refer to FIG. 7; FIG. 7 is a view of the pattern of a trim mask used in a second light exposure, wherein the pattern is used to form the pattern of the contact windows at the ends of the semi-dense line 201a and the dense line 202. The trim mask is employed for the light exposure on the same region after the exposure of the PSM in FIG. 5. As shown here, the trim mask comprises a clear region 401, an opaque region 410a, an opaque region 410b and an opaque region 410c. Similarly, these three regions can be made of Cr, Al or MoSi . . . etc.. Since the main purpose of the present invention is not about the trim mask, the detailed process for double exposure is not to be elaborated here.

Figure 8:
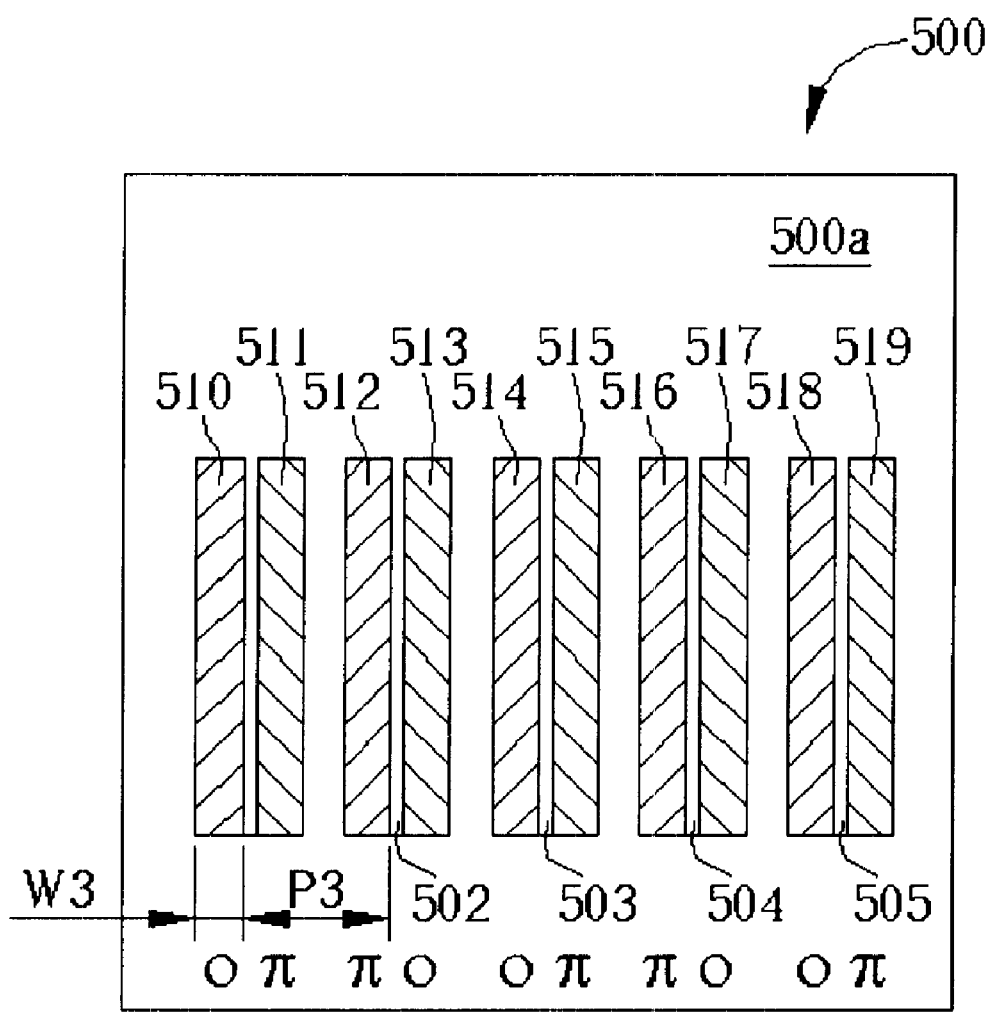
FIG. 8 is the partial view of an alternating phase shifting mask in the third embodiment according to the present invention.

Please refer to FIG. 8; FIG. 8 is a partial view of the Alt-PSM 500 in the third embodiment of the present invention. In this embodiment, the Alt-PSM 500 comprises an opaque region 500a, which comprises a plurality of semi-dense line patterns 501, 502, 503, 504 and 505 with line width smaller than 0.18 nm. The semi-dense line patterns 501, 502, 503. 504 and 505 have approximately the same pitch P3 (which is line width plus line distance) between 400 nm and 700 nm. Besides these, the Alt-PSM also comprises 0 degree phase shifting regions 510, 513, 514, 517, 518 with a width of w3, which is between 200 nm and 1000 nm, and 180 degree phase shifting regions 511, 512, 515, 516, 519. In another embodiment of the present invention, the phase of regions 510, 513, 514, 517 and 518 is 180 degree, while the phase of regions 511, 512, 515, 516 and 519 is 0 degree.

Figure 9:
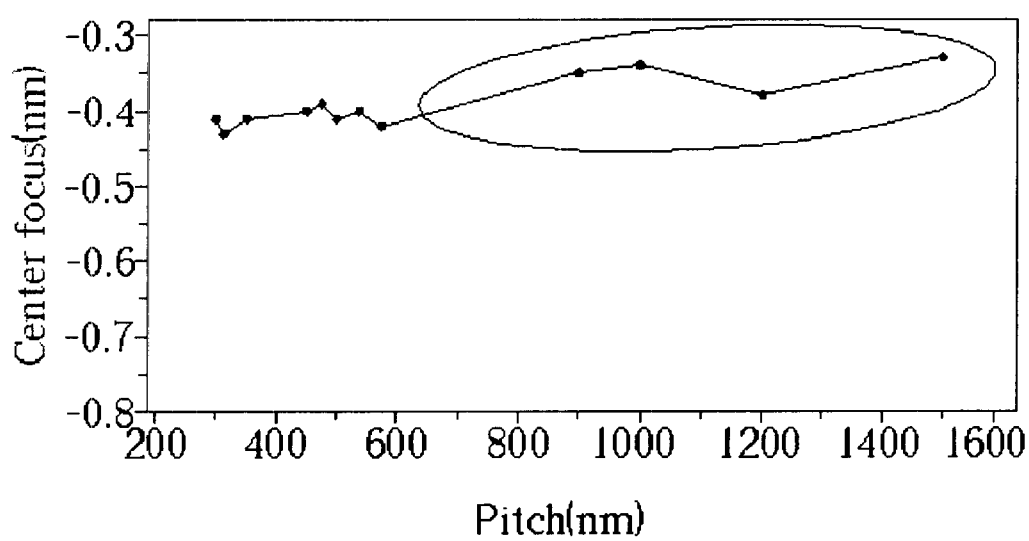
FIG. 9 is a plot of center focus vs. pitch produced by an alternating phase shifting mask according to the present invention.
Figure 10:
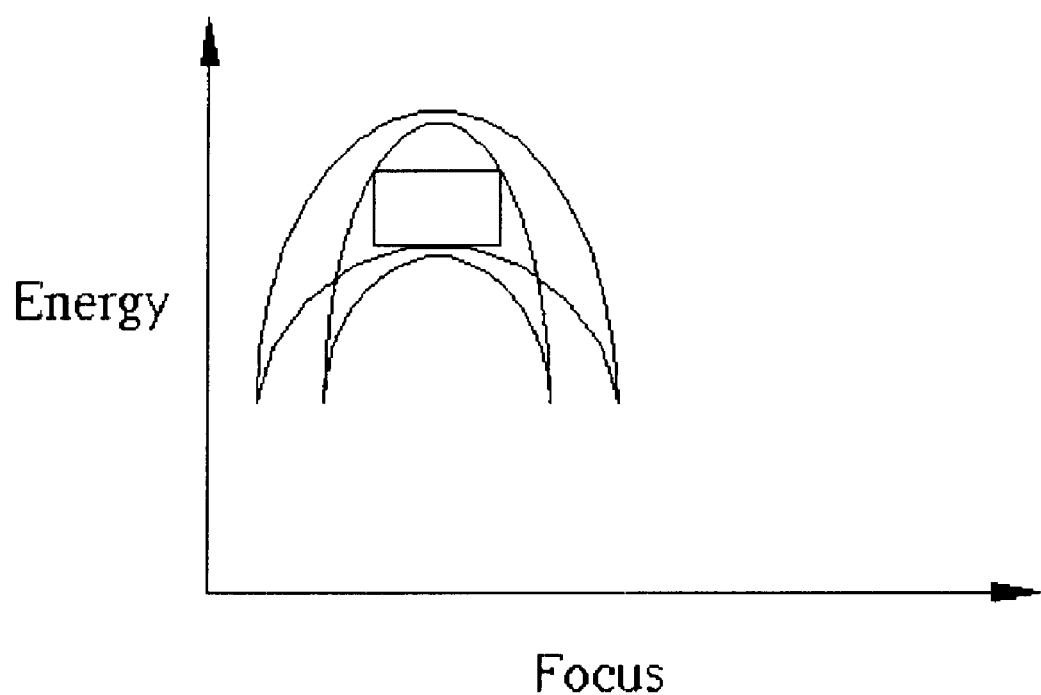
FIG. 10 is a plot of energy vs. focus produced by an alternating phase shifting mask according to the present invention.

Please refer to FIG. 9; FIG. 9 is a plot of center focus vs. pitch produced by an Alt-PSM according to the present invention; wherein the Y-axis is center focus in um, and the X-axis is pitch in nm. As shown here, as the pitches on the Alt-PSM exceed 500 nm, namely a semi-dense line pattern, a shift in center focus doesn't occur. Between the pitches 400 nm and 700 nm (the circled part), the center focuses are maintained between 0.35 um and 0.45 um. Therefore, it is acknowledged that the problem of narrowness of a process window created by the dense line patterns and the semi-dense line patterns on a conventional phase shifting mask is improved to large degree, as shown in FIG. 10.

The present invention is distinguished from the prior art for that in the prior art, the larger phase shifting region is created on the side of the semi-dense line with the larger pitch for the convenience in PSM making, which worsens the spherical aberration problem in the semi-dense line region; while in the present invention, the semi-dense lines are confined to the phase shifting region with the larger pitch, so as to correct the spherical aberration problem caused by the semi-dense line pattern and thus expands the size of process window.

The description above is the preferred embodiment of the present invention. Those skilled in the art will readily observe that numerous modification and alterations of the advice may be made while retaining the teachings of the invention. Accordingly, the above disclosure should be construed as limited only by the metes and bounds of the appended claims.

What is claimed is:

1. An alternating phase shifting mask (Alt-PSM) comprising:
   a quartz substrate;
   a dense line pattern formed on the substrate;
   at least one semi-dense line pattern formed on the substrate along an edge of the dense line pattern;
   a first phase shifting area having a first selected width positioned contiguous with the dense line pattern between the dense line pattern and the semi-dense line pattern;
   a second phase shifting area having a second selected width positioned contiguous with the semi-dense line pattern between the dense line pattern and the semi-dense line pattern, the second phase shifting area being disconnected from the first phase shifting area; and
   a third phase shifting area positioned contiguous with the semi-dense line pattern opposite to the second phase shifting area, the third phase shifting area having a width substantially equal to the width of the second phase shifting area;
   wherein a phase difference between the first phase shifting area and the second phase shifting area is approximately 0 degrees, while the phase difference between the second phase shifting area and the third phase shifting area is approximately 180 degrees.

2. The Alt-PSM of claim 1 further comprising an effectively clear area between the first phase shifting area and the second phase shifting area.

3. The Alt-PSM of claim 1 wherein the first phase shifting area and the second phase shifting area both have a phase that is approximately 0 degrees, while the third phase shifting area has a phase that is approximately 180 degrees.

4. The Alt-PSM of claim 1 wherein the first phase shifting area and the second phase shifting area both have a phase that is approximately 180 degrees, while the third phase shifting area has a phase that is approximately 0 degrees.

5. The Alt-PSM of claim 1 wherein the dense line pattern and the semi-dense line pattern are both composed of an opaque material.

6. The Alt-PSM of claim 5 wherein the opaque material comprises chromium (Cr).

7. The Alt-PSM of claim 1 wherein the first selected width and the second selected width both range between 200 nm and 1000 nm.

8. The Alt-PSM of claim 1 wherein the first selected width and the second selected width are both 200 nm.

9. A phase shifting mask (PSM) comprising:
   an effectively transparent substrate;
   at least one semi-dense line positioned on the substrate, wherein the semi-dense line is adjacent to a dense line pattern having a narrow pitch on one side, and on another other side of the dense line pattern is a clear area having a width greater than 2 micrometers;
   a first phase shifting area positioned contiguous to the semi-dense line between the dense line pattern and the semi-dense line; and
   a second phase shifting area having a selected width positioned contiguous to the semi-dense line on a side opposite to the first phase shifting area;
   wherein a phase difference between the first phase shifting area and the second phase shifting area is approximately 180 degrees.

10. The PSM of claim 9 wherein the first phase shifting area has a phase of approximately 0 degrees, and the second phase shifting area has a phase of approximately 180 degrees.

11. The PSM of claim 9 wherein the first phase shifting area has a phase of approximately 180 degrees, while the second phase shifting area has a phase of approximately 0 degrees.

12. The PSM of claim 9 wherein the dense line pattern and the semi-dense line are both composed of an opaque material.

13. The PSM of claim 12 wherein the opaque material comprises chromium (Cr).

14. The PSM of claim 9 wherein the selected width ranges between 200 nm and 400 nm.

* * * * *